United States Patent
Sun et al.

(10) Patent No.: US 11,018,223 B2
(45) Date of Patent: May 25, 2021

(54) METHODS FOR FORMING DEVICE ISOLATION FOR SEMICONDUCTOR APPLICATIONS

(71) Applicant: Applied Materials, Inc., Santa Clara, CA (US)

(72) Inventors: Shiyu Sun, Santa Clara, CA (US); Nam Sung Kim, Sunnyvale, CA (US); John O. Dukovic, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/502,129

(22) Filed: Jul. 3, 2019

(65) Prior Publication Data

US 2020/0335583 A1    Oct. 22, 2020

Related U.S. Application Data

(60) Provisional application No. 62/701,234, filed on Jul. 20, 2018.

(51) Int. Cl.
    *H01L 29/06*     (2006.01)
    *H01L 21/02*     (2006.01)
    *H01L 29/66*     (2006.01)

(52) U.S. Cl.
    CPC .... *H01L 29/0673* (2013.01); *H01L 21/02532* (2013.01); *H01L 21/02565* (2013.01); *H01L 29/0649* (2013.01); *H01L 29/66795* (2013.01)

(58) Field of Classification Search
    None
    See application file for complete search history.

(56) References Cited

U.S. PATENT DOCUMENTS

| | | | |
|---|---|---|---|
| 9,276,064 B1 | 3/2016 | Zang et al. | |
| 9,484,406 B1* | 11/2016 | Sun | H01L 21/02236 |
| 9,653,547 B1* | 5/2017 | Chang | H01L 29/0673 |
| 2014/0001441 A1 | 1/2014 | Kim et al. | |
| 2014/0339507 A1 | 11/2014 | Leobandung | |
| 2015/0040822 A1* | 2/2015 | Olsen | C30B 25/186 |
| | | | 117/97 |
| 2015/0333162 A1 | 11/2015 | Bouche et al. | |
| 2015/0372115 A1 | 12/2015 | Koh et al. | |
| 2015/0372119 A1 | 12/2015 | Zhang et al. | |
| 2017/0069763 A1 | 3/2017 | Doris et al. | |
| 2017/0221708 A1* | 8/2017 | Bergendahl | H01L 21/3065 |
| 2019/0207028 A1* | 7/2019 | Cheng | H01L 29/7849 |
| 2019/0296127 A1* | 9/2019 | Cheng | B82Y 10/00 |

* cited by examiner

*Primary Examiner* — Charles D Garber
*Assistant Examiner* — Xiaoming Liu
(74) *Attorney, Agent, or Firm* — Patterson + Sheridan, LLP

(57) ABSTRACT

The present disclosure provide methods for forming nanowire structures with desired materials horizontal gate-all-around (hGAA) structures field effect transistor (FET) for semiconductor chips. In one example, a method of forming nanowire structures on a substrate includes forming a multi-material layer on a bottom structure on a substrate, wherein the multi-material layer includes repeating pairs of a first layer and a second layer, selectively removing the second layer from the multi-material layer from the substrate, and selectively oxidizing the bottom structure on the substrate after removing the second layer from the multi-material layer.

20 Claims, 5 Drawing Sheets

METHODS FOR FORMING DEVICE ISOLATION FOR SEMICONDUCTOR APPLICATIONS

CROSS-REFERENCE TO RELATED APPLICATIONS

This application claims benefit of U.S. Provisional Application Ser. No. 62/701,234 filed Jul. 20, 2018, which is incorporated by reference in its entirety.

BACKGROUND

Field

Embodiments of the present invention generally relate to methods for forming vertically stacked nanowires with desired materials on a semiconductor substrate, and more particularly to methods for forming vertically stacked nanowires on a semiconductor substrate with desired materials for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density and quality of individual substrates and die.

As circuit densities increase for next generation devices, the widths of interconnects, such as vias, trenches, contacts, gate structures and other features, as well as the dielectric materials therebetween, decrease to 25 nm and 20 nm dimensions and beyond, whereas the thickness of the dielectric layers remain substantially constant, with the result of increasing the aspect ratios of the features. Furthermore, reduced channel length often causes significant short channel effect with conventional planar MOSFET architecture. In order to enable fabrication of next generation devices and structures, a three dimensional (3D) device structure is often utilized to improve performance of the transistors. In particular, fin field effect transistors (FinFET) are often utilized to enhance device performance. FinFET devices typically include semiconductor fins with high aspect ratios in which the channel and source/drain regions for the transistor are formed thereover. A gate electrode is then formed over and alongside of a portion of the fin devices utilizing the advantage of the increased surface area of the channel and source/drain regions to produce faster, more reliable and better-controlled semiconductor transistor devices. Further advantages of FinFETs include reducing the short channel effect and providing higher current flow. Device structures with horizontal gate-all-around (hGAA) configurations often provide superior electrostatic control by surrounding gate to suppress short channel effect and associated leakage current.

In some applications, hGAA structures are utilized for next generation semiconductor device applications. The hGAA device structure includes several lattice matched channels (e.g., nanowires) suspended in a stacked configuration and connected by source/drain regions.

In hGAA structures, different materials are often utilized to form the channel structures (e.g., nanowires), which may undesirably increase the manufacturing difficulty in integrating all these materials in the nanowire structures without deteriorating the device performance. For example, some of the challenges associated with hGAA structures include the existence of large parasitic capacitance between the metal gate and source/drain and a relatively high current leakage. Improper management of the parasitic capacitance and the current leakage may result in much degraded device performance.

Thus, there is a need for improved methods for devices structures for hGAA device structures on a substrate with good leakage control and device isolation.

SUMMARY

The present disclosure provides methods for forming nanowire structures for horizontal gate-all-around (hGAA) structures in semiconductor applications with proper device isolation and electrical performance. In one example, a method of forming nanowire structures on a substrate includes forming a multi-material layer on a bottom structure on a substrate, wherein the multi-material layer includes repeating pairs of a first layer and a second layer, selectively removing the second layer from the multi-material layer from the substrate, and selectively oxidizing the bottom structure on the substrate after removing the second layer from the multi-material layer.

In another example, a method of forming nanowire structures on a substrate includes forming a multi-material layer on a bottom structure disposed on a substrate, wherein the multi-material layer includes repeating pairs of a first layer and a second layer, wherein the second layer and the bottom structure are Ge containing silicon layers, wherein a ratio of the Ge element in the bottom structure is less than a ratio of the Ge element in the second layer, selectively removing the second layer from the multi-material layer from the substrate, and selectively oxidizing the bottom structure on the substrate under a pressure greater than 20 bar.

In yet another example, a method of forming nanowire structures on a substrate includes forming a multi-material layer on a bottom structure disposed on a substrate, wherein the multi-material layer includes repeating pairs of a first layer and a second layer, wherein the second layer and the bottom structure are Ge containing silicon layers, wherein a ratio of the Ge element in the bottom structure is less than a ratio of the Ge element in the second layer, selectively removing the second layer from the multi-material layer from the substrate, selectively oxidizing the bottom structure on the substrate under a pressure greater than 20 bar, and forming a silicon germanium oxide layer from the bottom structure between the first layer and the substrate.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Methods for manufacturing nanowire structures with controlled parasitic capacitance and leakage current for a horizontal gate-all-around (hGAA) semiconductor device structure are provided. In one example, a device structure comprising a multi-layer material structure comprising different materials (e.g., a first material and a second material) arranged in an alternatingly stacked formation may be formed on a bottom structure disposed on a substrate to be later utilized as nanowires (e.g., channel structures) for horizontal gate-all-around (hGAA) semiconductor device structures. The material in the multi-layer material has a different element ratio from the bottom structure, to assist the selective removal process while forming the nanowire structures. A selective oxidation process may be performed to selectively form an oxidation structure (e.g., a bottom oxidation isolation) on a bottom structure of the device structure so that proper isolation between the device structures and the substrate is provided. The oxidation selectivity of the bottom structure to the multiple layer structure is greater than 5:1. By doing so, the leakage current at the interface between the structure devices and the substrate, such as between the nanowires and the source/drain regions and the substrate, is properly managed and reduced.

Figure 1:
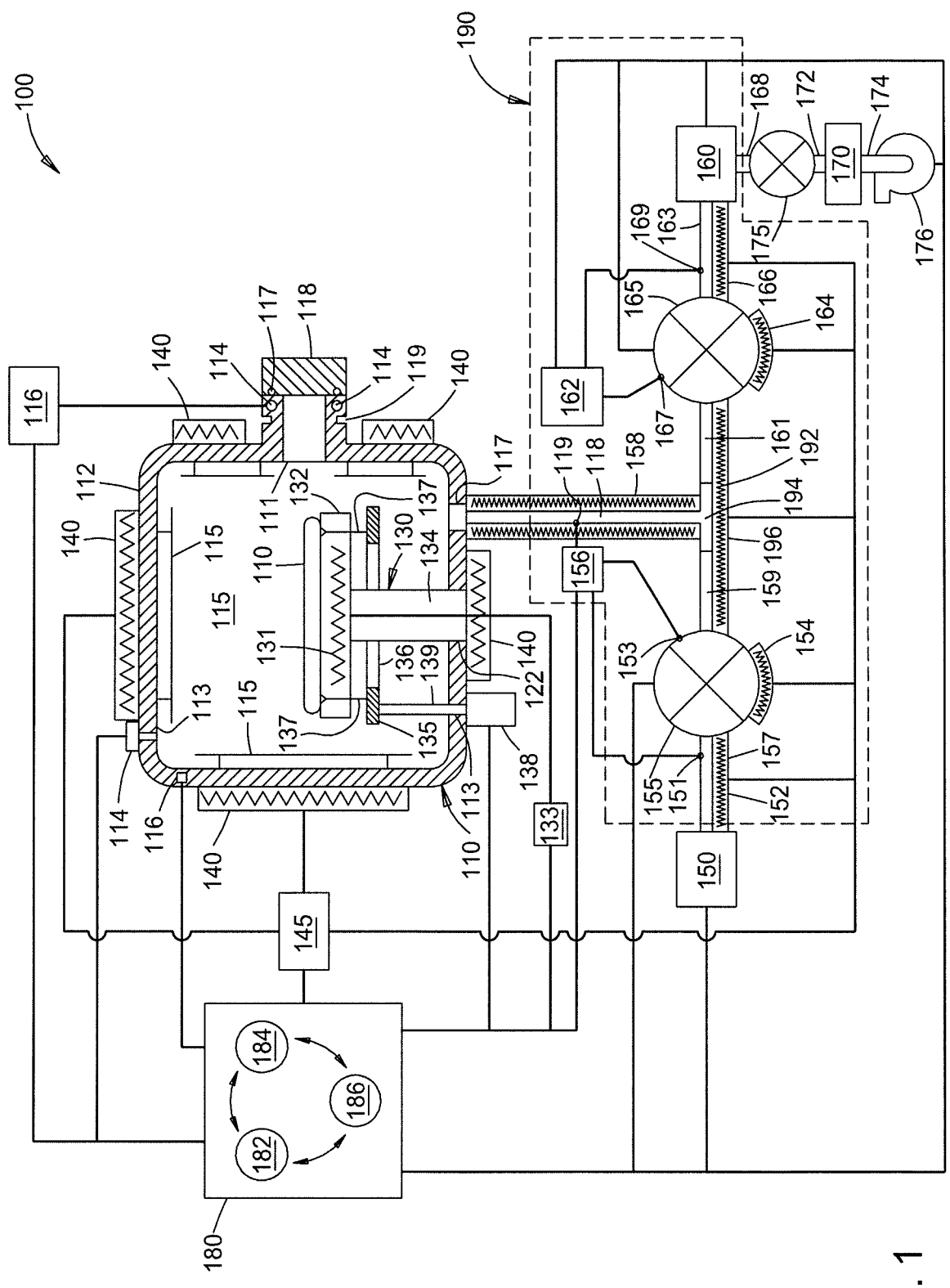
FIG. 1 is a simplified front cross-sectional view of a processing chamber in accordance with some embodiments.

FIG. 1 is a simplified front cross-sectional view of a single-substrate processing chamber 100 for a high-pressure annealing process of a single substrate. The single-substrate processing chamber 100 has a body 110 with an outer surface 112 and an inner surface 113 that encloses an internal volume 115. In some embodiments such as in FIG. 1, the body 110 has an annular cross section, though in other embodiments, the cross-section of the body 110 may be rectangular or any closed shape. The outer surface 112 of the body 110 may be made from a corrosion resistant steel (CRS), such as but not limited to stainless steel. One or more heat shields 125 are disposed on the inner surface 113 of the body 110 that prevents heat loss from the single-substrate processing chamber 100 into the outside environment. The inner surface 113 of the body 110 as well as the heat shields 125 may be made from nickel-based steel alloys that exhibit high resistance to corrosion, such as but not limited to HASTELLOY®, ICONEL®, and MONEL®.

A substrate support 130 is disposed within the internal volume 115. The substrate support 130 has a stem 134 and a substrate-supporting member 132 held by the stem 134. The stem 134 passes through a passage 122 formed through the chamber body 110. A rod 139 connected to an actuator 138 passes through a second passage 123 formed through the chamber body 110. The rod 139 is coupled to a plate 135 having an aperture 136 accommodating the stem 134 of the substrate support 130. Lift pins 137 are connected to the substrate-supporting member 132. The actuator 138 actuates the rod 139 such that the plate 135 is moved up or down to connect and disconnect with the lift pins 137. As the lift pins 137 are raised or lowered, the substrate-supporting member 132 is raised or lowered within the internal volume 115 of the chamber 100. The substrate-supporting member 132 has a resistive heating element 131 embedded centrally within. A power source 133 is configured to electrically power the resistive heating element 131. The operation of the power source 133 as well as the actuator 138 is controlled by a controller 180.

The single-substrate processing chamber 100 has an opening 111 on the body 110 through which one or more substrates 120 can be loaded and unloaded to and from the substrate support 130 disposed in the internal volume 115. The opening 111 forms a tunnel 121 on the body 110. A slit valve 128 is configured to sealably close the tunnel 121 such that the opening 111 and the internal volume 115 can only be accessed when the slit valve 128 is open. A high-pressure seal 127 is utilized to seal the slit valve 128 to the body 110 in order to seal the internal volume 115 for processing. The high-pressure seal 127 may be made from a polymer, for example a fluoropolymer, such as but not limited to a perfluoroelastomer and polytetrafluoroethylene (PTFE). The high-pressure seal 127 may further include a spring member for biasing the seal to improve seal performance. A cooling channel 124 is disposed on the tunnel 121 adjacent to the high-pressure seals 127 in order to maintain the high-pressure seals 127 below the maximum safe-operating temperature of the high-pressure seals 127 during processing. A cooling agent from a cooling fluid source 126, such as but not limited to an inert, dielectric, and high-performance heat transfer fluid, may be circulated within the cooling channel 124. The flow of the cooling agent from the cooling fluid source 126 is controlled by the controller 180 through feedback received from a temperature sensor 116 or a flow sensor (not shown). An annular-shaped thermal choke 129 is formed around the tunnel 221 to prevent the flow of heat from the internal volume 115 through the opening 111 when the slit valve 128 is open.

The single-substrate processing chamber 100 has a port 117 through the body 110, which is fluidly connected to a fluid circuit 190 connecting the gas panel 150, the condenser 160 and the port 117. The fluid circuit 190 has a gas conduit 192, a source conduit 157, an inlet isolation valve 155, an exhaust conduit 163, and an outlet isolation valve 165. A number of heaters 196, 158, 152, 154, 164, 166 are interfaced with different portions of the fluid circuit 190. A number of temperature sensors 151, 153, 119, 167 and 169 are also placed at different portions of the fluid circuit 190 to take temperature measurements and send the information to the controller 180. The controller 180 uses the temperature measurement information to control the operation of the heaters 152, 154, 158, 196, 164, and 166 such that the temperature of the fluid circuit 190 is maintained at a temperature above the condensation point of the processing fluid disposed in the fluid circuit 190 and the internal volume 115.

The gas panel 150 is configured to provide a processing fluid under pressure the internal volume 115. The pressure of the processing fluid introduced into the internal volume 115 is monitored by a pressure sensor 114 coupled to the body 110. The condenser 160 is fluidly coupled to a cooling fluid source (not shown) and configured to condense the gas phase processing fluid exiting the internal volume 115 through the gas conduit 192. The condensed processing fluid is then removed by the pump 176. One or more heaters 140 are disposed on the body 110 and configured to heat the internal volume 115 within the single-substrate processing chamber 100. The heaters 140, 152, 154, 158, 196, 164, and 166 maintain the processing fluid within the fluid circuit 190 in a gaseous phase while the outlet isolation valve 165 to the condenser 160 is open to prevent condensation within the fluid circuit.

The controller 180 controls the operation of the single-substrate processing chamber 100. The controller 180 controls the operation of the gas panel 150, the condenser 160, the pump 170, the inlet isolation valve 155, the outlet isolation valve 165, and the power sources 133 and 145. The controller 180 is also communicatively connected to the temperature sensor 116, the pressure sensor 114, the actuator 138, the cooling fluid source 126 and the temperature reading devices 156 and 162.

The processing fluid may comprise an oxygen-containing and/or nitrogen-containing gas, and/or chalcogen or tellurium (such as S, Se, Te) gases or vapors such as oxygen, dry steam, water, hydrogen peroxide, ammonia, S vapor, Se vapor, $H_2S$, $H_2Se$, etc. The processing fluid may be reacted with the metal materials on the substrate to form metal oxynitrides, metal oxides, metal oxychalcogenides or metal chalcogenides. Alternatively or in addition to the oxygen-containing and/or nitrogen-containing gases, the processing fluid may comprise a silicon-containing gas. Examples of the silicon-containing gas include organosilicon, tetraalkyl orthosilicate gases and disiloxane. Organosilicon gases include gases of organic compounds having at least one carbon-silicon bond. Tetraalkyl orthosilicate gases include gases consisting of four alkyl groups attached to an $SiO_4^{4-}$ ion. More particularly, the one or more gases may be (dimethylsilyl)(trimethylsilyl)methane $((Me)_3SiCH_2SiH(Me)_2)$, hexamethyldisilane $((Me)_3SiSi(Me)_3)$, trimethylsilane $((Me)_3SiH)$, trimethylsilylchloride $((Me)_3SiCl)$, tetramethylsilane $((Me)_4Si)$, tetraethoxysilane $((EtO)_4Si)$, tetramethoxysilane $((MeO)_4Si)$, tetrakis-(trimethylsilyl)silane $((Me_3Si)_4Si)$, (dimethylamino)dimethyl-silane $((Me_2N)SiHMe_2)$ dimethyldiethoxysilane $((EtO)_2Si(Me)_2)$, dimethyl-dimethoxysilane $((MeO)_2Si(Me)_2)$, methyltrimethoxysilane $((MeO)_3Si(Me))$, dimethoxytetramethyl-disiloxane $(((Me)_2Si(OMe))_2O)$, tris(dimethylamino)silane $((Me_2N)_3SiH)$, bis(dimethylamino)methylsilane $((Me_2N)_2CH_3SiH)$, disiloxane $((SiH_3)_2O)$, and combinations thereof.

During processing of the substrates 120, an environment of the high-pressure region 115 is maintained at a temperature and pressure that maintains the processing fluid within the high-pressure region in a vapor phase. Such pressure and temperature is selected based on the composition of the processing fluid. In the case of steam, the temperature and pressure is held at a condition that maintains the steam in a dry steam state. In one example, high-pressure region 115 is pressurized to a pressure greater than atmosphere, for example greater than about 2 bars. In another example, high-pressure region 115 is pressurized to a pressure from between about 10 and about 50 bars, such as from between about 20 and about 50 bars. In another example, the high-pressure region 115 is pressurized to a pressure up to about 100 bars. During processing, the high-pressure region 115 is also maintained at a high temperature, for example, a temperature exceeding 225 degrees Celsius (limited by the thermal budget of the substrates 120 disposed on the substrate-supporting member 132), such as between about 300 degrees Celsius and about 500 degrees.

Figure 2:
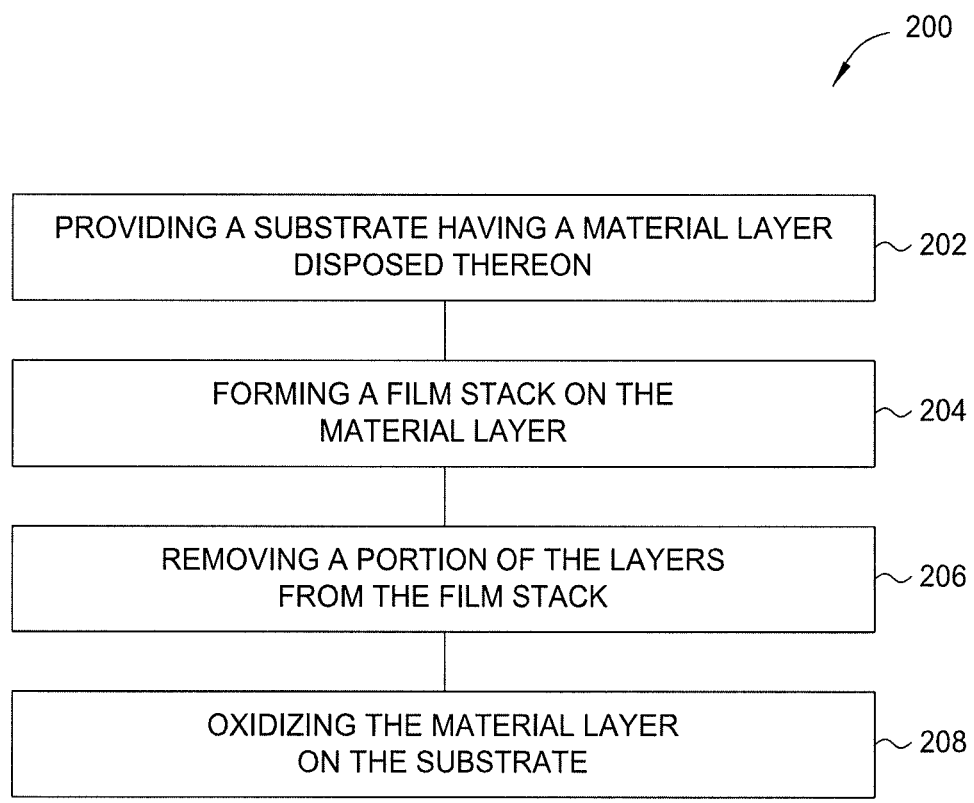
FIG. 2 depicts a flow diagram of a method for manufacturing nanowire structures formed on a substrate.

FIG. 2 is a flow diagram of one example of a method 200 for manufacturing nanowire structures (e.g., channel structures) with a bottom oxidation isolation for horizontal gate-all-around (hGAA) semiconductor device structures. FIGS. 3A-3D are cross-sectional views of a portion of a nanowire structure corresponding to various stages of the method 200. The method 200 may be utilized to form the nanowire structure for horizontal gate-all-around (hGAA) semiconductor device structures on a substrate having desired materials, which may later be utilized to form a field effect transistor (FET). Alternatively, the method 200 may be beneficially utilized to manufacture other types of structures.

Figure 3A:
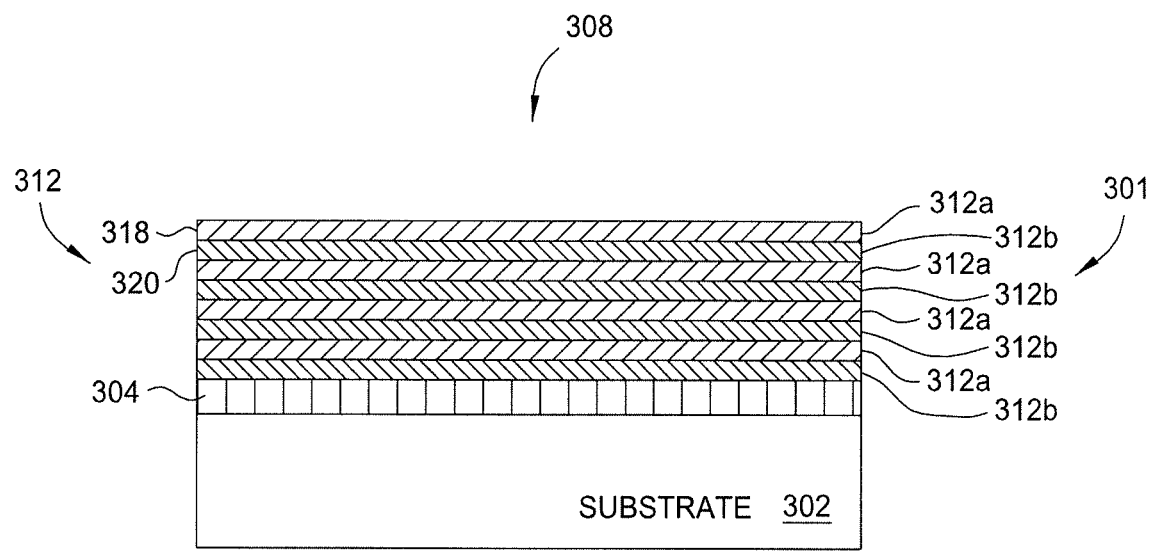
FIGS. 3A-3D depict cross sectional views of one example of a sequence for forming a nanowire structure with desired isolation structure during the manufacturing process of FIG. 2.

The method 200 begins at operation 202 by providing a substrate 302, having a film stack 301 formed thereon, as shown in FIG. 3A. A bottom structure 304 is formed between a film stack 301 and the substrate 302. The substrate 302 may be a material such as crystalline silicon (e.g., Si<100> or Si<111>), silicon oxide, strained silicon, silicon germanium, germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate 302 may have various dimensions, such as 200 mm, 300 mm, 450 mm or other diameter, as well as, being a rectangular or square panel. Unless otherwise noted, examples described herein are conducted on substrates with a 200 mm diameter, a 300 mm diameter, or a 450 mm diameter substrate.

At operation 204, the film stack 301 is formed on the bottom structure 304 disposed on the substrate 302. The film stack 301 includes a multi-material layer 312 disposed on the bottom structure 304. In one example, the bottom structure 304 is formed from a material similar to at least one of the materials from the multi-material layer 312 but with different element ratios. The bottom structure 304 will later be converted to an oxidation insulation structure to provide proper desired insulation between the film stack 301 and the substrate 302.

The multi-material layer 312 includes at least one pair of layers, each pair comprising a first layer 312a and a second layer 312b. Although the example depicted in FIG. 3A shows four pairs, each pair including the first layer 312a and the second layer 312b (alternating pairs, each pair comprising the first layer 312a and the second layer 312b), it is noted that number of pairs, each comprising a first layer 312a and a second layer 312b, may be varied based on different process needs. In one example, the multi-material layer 312 includes at least two or four pair of layers. In one particular embodiment, four pairs of the first and second layers, 312a, 312b may be deposited to form the multi-material layer 312 on the substrate 302. In one implementation, the thickness of each single first layer 312a may be at between about 20 Å and about 200 Å, such as about 50 Å, and the thickness of the each single second layer 312b may be at between about 20 Å and about 200 Å, such as about 50 Å. The multi-material layer 312 may have a total thickness between about 10 Å and about 5000 Å, such as between about 40 Å and about 4000 Å.

The first layer 312a may be a crystalline silicon layer, such as a single crystalline, polycrystalline, or monocrystalline silicon layer, formed by an epitaxial deposition process. Alternatively, the first layer 312a may be a doped silicon layer, including a p-type doped silicon layer or a n-type doped silicon layer. Suitable p-type dopants include B dopants, Al dopants, Ga dopants, In dopants, or the like.

Suitable n-type dopants include N dopants, P dopants, As dopants, Sb dopants, or the like. In yet another example, the first layer 312a may be a group III-V material, such as a GaAs layer.

The second layer 312b may be a Ge containing layer, such as a SiGe layer, Ge layer, or other suitable layer. Alternatively, the second layer 312b may be a doped silicon layer, including a p-type doped silicon layer or a n-type doped layer. In some examples, the second layer 312b may be a group III-V material, such as a GaAs layer, or a high-k material coating on outer surfaces of the metal material. Suitable examples of the high-k material includes hafnium dioxide ($HfO_2$), zirconium dioxide ($ZrO_2$), hafnium zirconium oxide ($HfZrO_4$), hafnium silicate oxide ($HfSiO_4$), hafnium aluminum oxide (HfAlO), zirconium silicate oxide ($ZrSiO_4$), tantalum dioxide ($TaO_2$), aluminum oxide, aluminum doped hafnium dioxide, bismuth strontium titanium (BST), or platinum zirconium titanium (PZT), among others. In one particular implementation, the coating layer is a hafnium dioxide ($HfO_2$) layer.

In one example depicted herein, the second layer 312b is a silicon rich Ge containing layer (e.g., a Ge containing silicon layer). The second layer 312b may have a formula of $SiGe_x$, wherein x is less than 0.5, such as ranged from 0.2 to 0.45. The ratio of the silicon element in the second layer 312b is greater than the ratio of the Ge element in the second layer 312b, so that the second layer 312b is called as a silicon rich Ge containing layer. In one example, x in the formula of $SiGe_x$ is between about 0.25 and 0.3 for the second layer 312b. In an example, the first layer 312a may be a silicon layer, such as a single crystalline, polycrystalline, or monocrystalline silicon layer, and the second layer 312b is a $SiGe_x$ having x between about 0.25 or 0.3.

The bottom structure 304 as formed herein is also a SiGe layer. However, the bottom structure 304 is a silicon rich Ge containing layer with less Ge ratio, as compared to the Si rich Ge containing layer of the second layer 312b. Similarly, the SiGe layer of the bottom structure 304 also has a formula of $SiGe_y$, wherein y is less than 0.23, such as ranged from 0.01 and 0.2, such as between about 0.08 and about 0.16. The ratio of the Ge element in the bottom structure 304 is less than the ratio of the Ge element in second layer 312b. In one example, y in the formula of $SiGe_y$ is between about 0.01 and 0.2 for the bottom structure 304. In an example, the bottom structure 304 is a $SiGe_y$ having y of between about 0.1 and about 0.15.

Figure 3B:
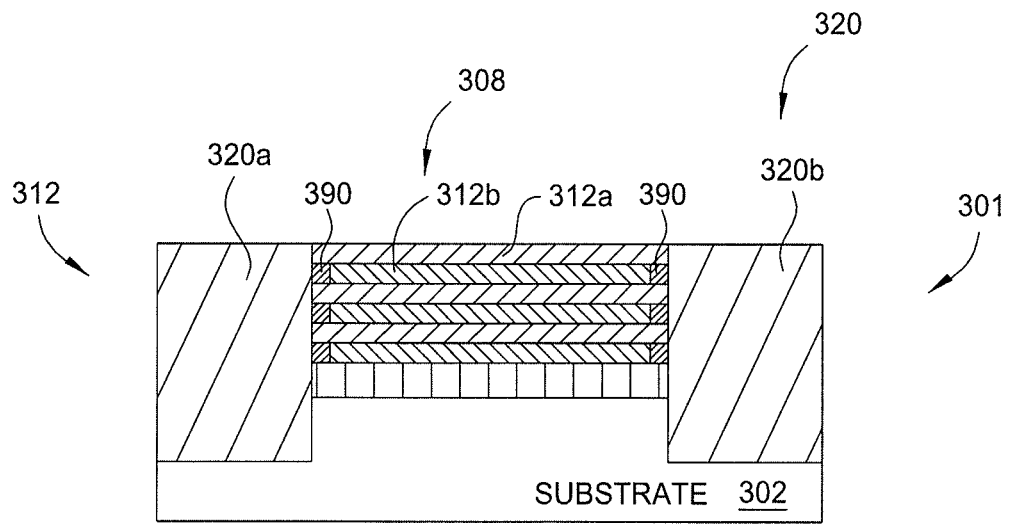

After the film stack 301 is formed, a patterning process is performed to form source/drain anchors 320 (shown as 320a, 320b), as shown in FIG. 3B. The source/drain anchors 320 may be formed by an epitaxial deposition process. The source/drain anchors 320 may be intrinsic epi-silicon layer or a p-type dopant or a n-type dopant silicon layer as needed. Furthermore, an inner spacer structure 390 may also be formed at the two ends of the second layer 312b prior to forming the source/drain anchors 320 (shown as 320a, 320b) to improve device performance as needed.

Figure 3C:
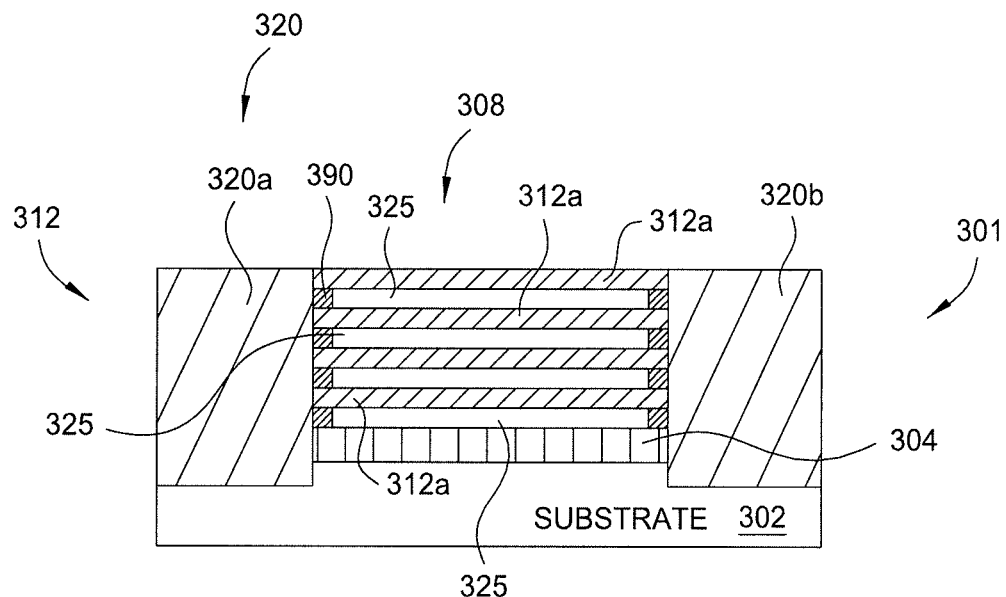

At operation 206, a selective etching process is performed to remove a portion of the multi-material layer 312, such as the second layer 312b, from the film stack 301, as shown in FIG. 3C. It is noted that prior to the selective etching process, a dummy gate removal process, a poly gate removal process, or a structure removal process may be performed to remove additional structures (not shown) from the substrate 302 as needed.

The selective etching process as performed here removes (partially or entirely) one type of multi-material layer 312 from the substrate 302, forming a suspended nanowire structure on the substrate 302 between the source anchor 320a and the drain anchor 320b. In the example depicted in FIG. 3C, the second layer 312b is removed by the selective etching process. The second layer 312b may be partially removed as depicted in FIG. 3C, forming an opening 325 between each of the first layer 312a in the suspended nanowire structure. Alternatively, during the selective etching process, the first layer 312a may be partially removed as needed (not shown), rather than the second layer 312b depicted in FIG. 3C.

Based on different process requirements, different etching precursors are selected to selectively and specifically etch either the first layer 312a or the second layer 312b. As the first and the second layers 312a, 312b on the substrate 302 has substantially the same dimensions as well as the bottom structure 304, the etching precursors are selected to have high selectivity between the first and the second layers 312a, 312b and the bottom structure 304 (and/or the inner spacer structure 390, if present), and thus are be able to target and selectively etch only either the first layer 312a or the second layer 312b (the example shown in FIG. 3C) without attacking or damaging the other (i.e., non-target) layer and the bottom structure 304. After the targeted material (e.g., the second layer 312b in FIG. 3C) is removed from the substrate 302, forming the opening 325 for manufacturing the nanowire structure, the selective etching process at operation 206 may then be terminated.

As discussed above, the ratio of the Ge element from the bottom structure 304 is less than the ratio of the Ge element from the second layer 312b. Thus, by a proper selection of the etching gas mixture, a selective etching process may be obtained to particularly etch the second layer 312b, without attacking or etching the bottom structure 304 as well as the first layer 312a (also, other structures on the substrate, such as the source/drain anchors 320). In the example depicted in FIG. 3C, the etching precursors are selected particularly to etch the second layer 312b without attacking or damaging the first layer 312a and the bottom structure 304. In one example wherein the first layer 312a is an intrinsic epi-Si layer and the second layer 312b is a SiGe layer having a Ge ratio greater than the Ge ratio of the bottom structure 304, the etching precursor selected to etch the second layer 312b include at least a carbon fluorine containing gas or halogen containing gas. Suitable examples of the carbon fluorine containing gas may include $CF_4$, $C_4F_6$, $C_4F_8$, $C_2F_2$, $CF_4$, $C_2F_6$, $C_5F_8$, and the like. Suitable examples of the halogen containing gas are $NF_3$, HF, $Cl_2$ and the like. A reacting gas, such as $O_2$ or $N_2$ may also be supplied with the carbon fluorine containing gas from the remote plasma source to promote the etching process. Further, a halogen containing gas may be supplied to the substrate surface to generate a plasma by a RF source power or a bias RF power or both, to further assist the etching process. Suitable halogen containing gases that may be supplied into the processing chamber include HCl, $Cl_2$, $CCl_4$, $CHCl_3$, $CH_2Cl_2$, $CH_3Cl$ or the like. In one example, a $CF_4$ and $O_2$ gas mixture may be supplied to the substrate surface to laterally etch the second layer 312b while a $Cl_2$ gas may be supplied to the processing chamber to be dissociated by either a RF source power or a bias RF power or both in the processing region 141 defined in the processing chamber 100. The $CF_4$ and $O_2$ may have a flow rate ratio between about 100:1 and about 1:100.

In one example, the chemical precursors selected to be supplied in the selective etching mixture may be varied for different film layer etching request. For example, when the first layer 312a is an intrinsic epi-Si layer and the second layer 312b being etched is a material other than SiGe, such as a doped silicon material, the etching precursor selected to etch the second layer 312b, e.g., the doped silicon layer, may be a halogen containing gas supplied into the processing chamber including $Cl_2$, HCl, or the like. The halogen containing gas, such as a $Cl_2$ gas, may be supplied to the substrate surface for etching.

During the selective etching process, several process parameters may also be controlled while supplying the etching gas mixture to perform the selective etching process. The pressure of the processing chamber may be controlled at between about 0.5 milliTorr and about 3000 milliTorr, such as between about 2 milliTorr and about 500 milliTorr or 2500 milliTorr. A substrate temperature is maintained between about 15 degrees Celsius to about 300 degrees Celsius, such as greater than 50 degrees Celsius, for example between about 60 degrees Celsius and about 110 degrees Celsius. The RF source power may be supplied at the lateral etching gas mixture between about 50 Watts and about 3000 Watts and at a frequency between about 400 kHz and about 13.56 MHz. A RF bias power may also be supplied as needed. The RF bias power may be supplied at between about 0 Watts and about 1500 Watts.

Figure 3D:
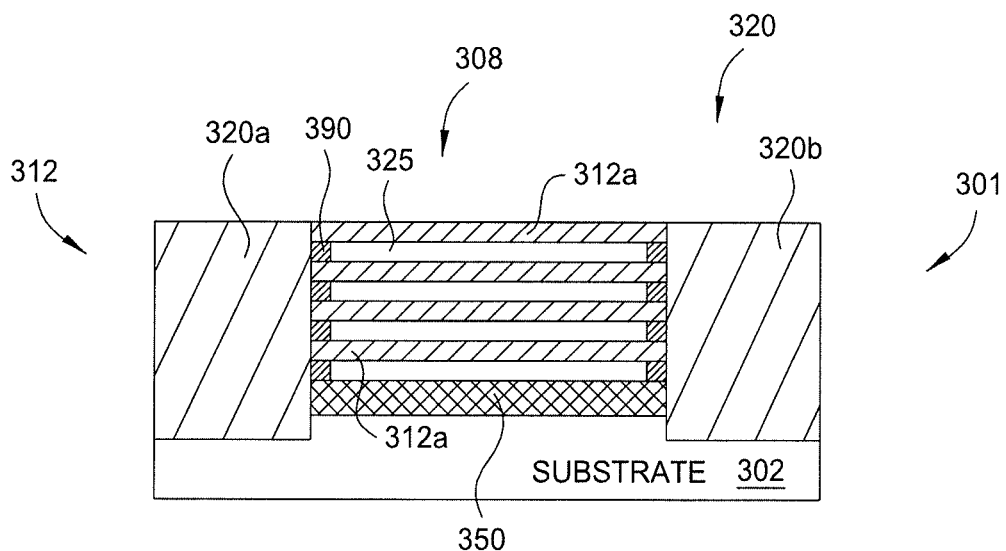

At operation 208, after the selective etching process, a selective oxidation process is performed to selectively form an oxidation insulation selectively on certain regions of the substrate 302, as shown in FIG. 3D. In the example depicted in FIG. 3D, as the first layer 312a and the bottom structure 304 are fabricated from different materials, when the selective oxidation process is performed, the oxidation process may predominately occur on one material relative to the other material. In the example depicted in FIG. 3D wherein the first layer 312a is a silicon layer and the bottom structure 304 is a SiGe layer, the selective oxidation process may be controlled to predominately occur on bottom structure 304, rather than on the first layer 312a. The selective oxidation process performed on the bottom structure 304 forms a bottom oxidation insulation 350 (e.g., a SiGeO layer) predominately on the bottom structure 304. It is believed that silicon-Ge alloy has higher activity than silicon dominated materials (e.g., Ge element has higher activity to be oxidized at a rate faster than the silicon element). Thus, when oxygen atoms are supplied, the oxygen atoms tend to react with Si atoms in SiGe alloy with a faster reacting rate, rather than with Si atoms from silicon dominated materials, thus providing a selective deposition process to predominately form the bottom oxidation insulation 350 from the bottom structure 304, rather than on the first layer 312a.

The oxidation process consumes the silicon atoms from the bottom structure 304 to form the bottom oxidation insulation 350. As the Si—Ge bonding is relatively weaker than Si—Si bonding, the silicon elements from the Si—Ge bonding may be relatively easy to be activated and moved during the oxidation process when oxygen elements are diffused to react with the silicon atoms to form the bottom oxidation insulation 350.

In contrast, as the silicon atoms in the first layer 312a do not have the Ge atoms to serve as an active driver to release silicon elements to react with the oxygen elements during the oxidation process, the oxidation rate in the first layer 312a is significantly lower than the oxidation rate in the bottom structure 304, thus providing a selective oxidation process that predominately forms the bottom oxidation insulation 350 from the bottom structure 304 rather than on the first layer 312a. In one example, the selectivity of the oxidation rate between the bottom structure (e.g., a SiGe layer) and the first layer 312a (e.g., a silicon layer) is greater than 5:1, such as about 6:1 and 15:1, such as about 10:1.

Furthermore, temperature is also factored during the oxidation process. The process temperature is expected to have an exponential impact on Si and Ge oxidation rate and an exponential impact on the relative rates (e.g., such as the selectivity between the first layer 312a and the bottom structure 304). Pressure is expected to have a substantially linear impact on Si and Ge oxidation rates. Thus, by adjusting the temperature and the pressure, alone or in combination, during the oxidation process, independent control of oxidation rate and oxidation selectivity can be achieved.

During the process of performing the selective oxidation process on the substrates 302, an environment of the high-pressure region 115, in the processing chamber 100 depicted in FIG. 1, is maintained at a temperature and pressure that maintains the processing fluid within the high-pressure region in a vapor phase. Such pressure and temperature is selected based on the composition of the processing fluid. In one example, high-pressure region 115 is pressurized to a pressure greater than atmosphere, for example greater than about 20 bars. In another example, high-pressure region 115 is pressurized to a pressure from about 30 to about 70 bars, such as from about 40 bars to about 60 bars, for example about 50 bars. In another example, the high-pressure region 115 is pressurized to a pressure up to about 100 bars. During processing, the high-pressure region 115 is also maintained at a predetermined temperature, for example, a temperature over 100 degrees Celsius (based on the thermal budget requirement from the substrates 120 disposed on the cassette) but less than 450 degrees Celsius, such as between about 150 degrees Celsius and about 400 degrees Celsius, for example between about 300 degrees Celsius and about 400 degrees Celsius, such as about 350 degrees Celsius.

It is believed that the high-pressure process may provide driving force to consume the silicon atoms where the oxygen atoms are present and diffused to form the bottom oxidation insulation 350. By doing so, a portion of the silicon atoms may be gradually converted into the bottom oxidation insulation 350 (e.g., silicon germanium oxide). In one implementation, the process temperature may be performed between about 100 degrees Celsius to about 400 degrees Celsius, for example between about 200 degree Celsius to about 380 degrees Celsius, such as between about 300 degrees Celsius and about 400 degrees Celsius.

In one implementation, the oxidation process may be performed in a high pressure processing chamber, such as the processing chamber 100 depicted in FIG. 1, a rapid thermal oxidation chamber or a thermal environment (such as furnace). The oxidation process may be performed by using an oxygen containing gas mixture, such as an oxidizer, in a processing environment to react the bottom structure 304, which is a Ge containing silicon material. In one implementation, the oxygen containing gas mixture includes at least one of an oxygen containing gas with or without an inert gas. Suitable examples of the oxygen containing gas include steam, $O_2$, $O_3$, $H_2O$, $H_2O_2$, $NO_2$, $N_2O$, moisture and the like. In one example, the oxygen containing gas includes steam or moisture. Suitable examples of the inert gas supplied with the treatment gas mixture include at least one of Ar, $N_2$, He, Kr, and the like. In an exemplary embodiment, the oxygen containing gas supplied in the oxygen containing gas mixture is steam supplied at a pressure greater than 20 bar.

In one exemplary implementation, a process pressure is regulated at a pressure greater than 20 bar, such as between about 30 and about 70 bars, such as from about 40 bars to about 60 bars, for example about 50 bars. The process temperature may be controlled at greater than 200 degrees Celsius but less than 450 degrees Celsius, such as between about 250 degrees Celsius and about 400 degrees Celsius, such as between about 300 degrees Celsius and about 380 degrees Celsius.

The overall process time of the oxidation process may be determined by time mode after a desired portion of the silicon atoms from the bottom structure 304 are predominantly reacted with the oxygen atoms to form the desired bottom oxidation isolation 350. In one example, the substrate 302 is subjected to the selective oxidation process for between about 60 seconds to about 1200 minutes, such as between about 5 and 10 minutes, depending on the oxidation rate of the bottom structure 304, pressure and flow rate of the gas. In an exemplary implementation, the substrate 302 is exposed to the oxidation processes for about 600 seconds or less.

In one example, after the selective oxidation process, the bottom oxidation isolation 350 is formed having a formula of $SiGe_aO_b$, wherein a is between about 0.01 and about 1, and b is between about 2 and about 4. The bottom oxidation isolation 350 has a thickness between about 5 nm and about 50 nm, such as between about 10 nm and about 20 nm.

Figure 4:
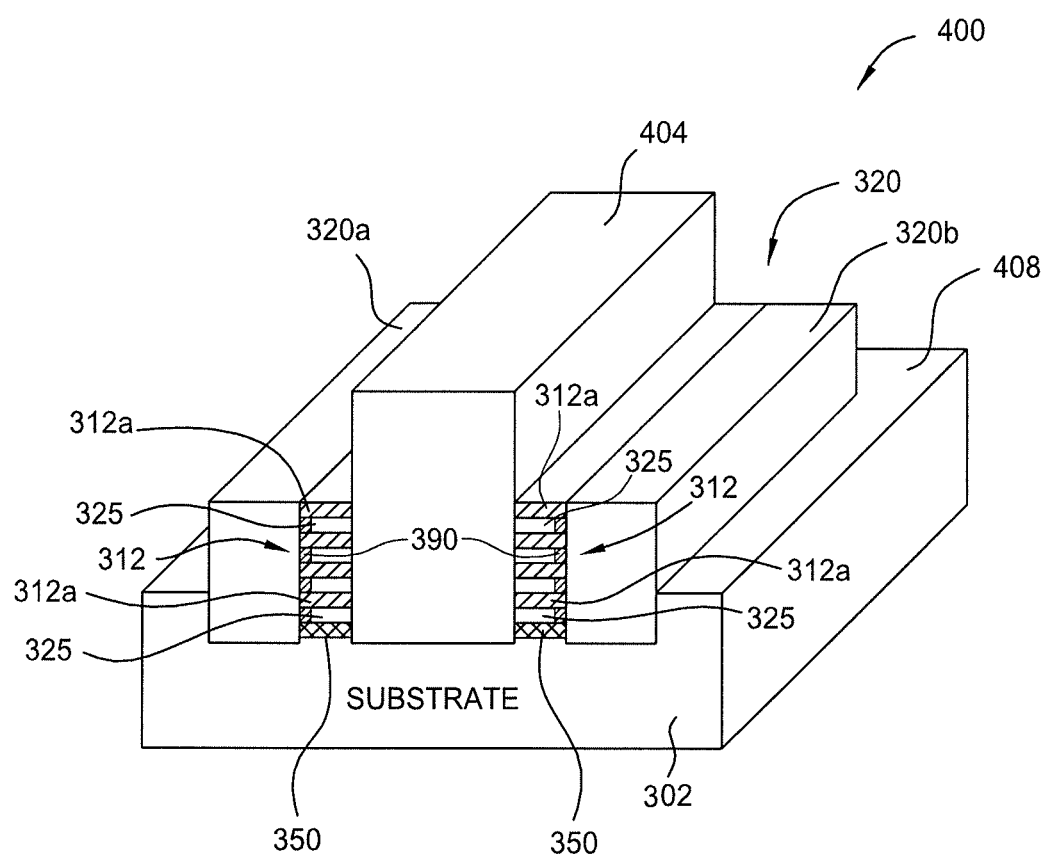
FIG. 4 depicts a schematic view of an example of a horizontal gate-all-around (hGAA) structure.

FIG. 4 depicts a schematic view of the multi-material layer 312 having pairs of the first layer 312a and the openings 325 (e.g., formed from the removal of the second layer 312b) and the bottom oxidation isolation 350 utilized in a horizontal gate-all-around (hGAA) structure 400. The horizontal gate-all-around (hGAA) structure 400 utilizes the multi-material layer 312 as nanowires (e.g., channels) between source/drain anchors 320 (also shown as 320a, 302b for source and drain anchors, respectively) and a gate structure 404. The bottom oxidation isolation 350 formed at the bottom of the horizontal gate-all-around (hGAA) structure 400 may assist managing the interface contacting the substrate 302 so as to reduce parasitic capacitance and maintain minimum device leakage.

Thus, methods for forming nanowire structures with reduced parasitic capacitance and minimum device leakage for horizontal gate-all-around (hGAA) structures are provided. The methods utilize selective oxidation process with high process pressure, such as greater than 20 bar, to selectively form an oxidation layer on certain types of material on the substrate so as to form nanowire structures with reduced parasitic capacitance and minimum device leakage at the interface that may be later utilized to form horizontal gate-all-around (hGAA) structures and the substrate. Thus, horizontal gate-all-around (hGAA) structures with desired type of material and device electrical performance may be obtained, particularly for applications in horizontal gate-all-around field effect transistors (hGAA FET).

While the foregoing is directed to embodiments of the present invention, other and further embodiments of the invention may be devised without departing from the basic scope thereof, and the scope thereof is determined by the claims that follow.

The invention claimed is:

1. A method of forming nanowire structures on a substrate comprising:
    forming a multi-material layer on a bottom structure on a substrate, wherein the multi-material layer includes repeating pairs of a first layer and a second layer;
    selectively removing the second layer from the multi-material layer from the substrate; and
    selectively oxidizing the bottom structure on the substrate with an oxygen containing gas at a pressure of about 30 bars to about 70 bars and a temperature less than about 450 Celsius after removing the second layer from the multi-material layer.

2. The method of claim 1, wherein the second layer is a Ge containing silicon layer.

3. The method of claim 2, wherein the bottom structure is a Ge containing silicon layer.

4. The method of claim 3, wherein the bottom structure has a ratio of the Ge element less than a ratio of the Ge element in the second layer.

5. The method of claim 3, wherein the second layer has a formula of $SiGe_x$, wherein x is less than 0.5.

6. The method of claim 5, wherein x is between about 0.2 and about 0.45.

7. The method of claim 3, wherein the bottom structure has a formula of $SiGe_y$, wherein y is less than 0.23.

8. The method of claim 7, wherein y is between about 0.01 and about 0.2.

9. The method of claim 1, further comprising:
    forming a bottom insulation structure from the bottom structure, wherein the bottom insulation structure is a SiGeO layer.

10. The method of claim 1, wherein selectively oxidizing the bottom structure on the substrate further comprises:
    predominantly oxidizing the bottom structure rather than the first layer in the multi-material layer.

11. The method of claim 10, oxidizing the bottom structure at an oxidation rate greater than an oxidation rate for oxidizing the first layer in the multi-material layer.

12. The method of claim 1, wherein the first layer of the multi-material layer is an intrinsic silicon material.

13. The method of claim 1, wherein selectively oxidizing the bottom structure on the substrate further comprises:
    maintaining a substrate temperature between about 200 degrees Celsius and about 400 degrees Celsius.

14. The method of claim 1, wherein selectively oxidizing the bottom structure on the substrate further comprises:
    supplying an oxygen containing gas mixture to the substrate, wherein the oxygen containing gas mixture comprises an oxygen containing gas selected from a group consisting of $O_2$, $O_3$, $H_2O$, $H_2O_2$, $NO_2$, $N_2O$, or steam.

15. The method of claim 14, wherein the oxygen containing gas mixture includes steam or moisture.

16. A method of forming nanowire structures on a substrate comprising:
    forming a multi-material layer on a bottom structure disposed on a substrate, wherein the multi-material layer includes repeating pairs of a first layer and a second layer, wherein the second layer and the bottom structure are Ge containing silicon layers, wherein a ratio of the Ge element in the bottom structure is less than a ratio of the Ge element in the second layer;
    selectively removing the second layer from the multi-material layer from the substrate; and
    selectively oxidizing the bottom structure on the substrate with an oxygen containing gas under a pressure greater than 20 bar and a temperature less than about 450 Celsius.

17. The method of claim 16, wherein selectively oxidizing the bottom structure further comprises:
    maintaining a substrate temperature between about 200 degrees Celsius and about 400 degrees Celsius.

18. The method of claim 16, wherein selectively oxidizing the bottom structure further comprises:
    supplying an oxygen containing gas mixture to the substrate, wherein the oxygen containing gas mixture comprises an oxygen containing gas selected from a group consisting of $O_2$, $O_3$, $H_2O$, $H_2O_2$, or steam.

19. The method of claim 16, further comprising:
forming a silicon geranium oxide layer from the bottom structure between the first layer and the substrate.

20. A method of forming nanowire structures on a substrate comprising:
forming a multi-material layer on a bottom structure disposed on a substrate, wherein the multi-material layer includes repeating pairs of a first layer and a second layer, wherein the second layer and the bottom structure are Ge containing silicon layers, wherein a ratio of the Ge element in the bottom structure is less than a ratio of the Ge element in the second layer;
selectively removing the second layer from the multi-material layer from the substrate;
selectively oxidizing with an oxygen containing gas the bottom structure on the substrate under a pressure greater than 20 bar and a temperature less than about 450 Celsius; and
forming a silicon geranium oxide layer from the bottom structure between the first layer and the substrate.

* * * * *

UNITED STATES PATENT AND TRADEMARK OFFICE
CERTIFICATE OF CORRECTION

Page 1 of 1

PATENT NO. : 11,018,223 B2
APPLICATION NO. : 16/502129
DATED : May 25, 2021
INVENTOR(S) : Shiyu Sun et al.

It is certified that error appears in the above-identified patent and that said Letters Patent is hereby corrected as shown below:

In the Specification

In Column 6, Line 2, delete "500 degrees." and insert -- 500 degrees Celsius. --, therefor.

In Column 10, Line 41, delete "200 degree" and insert -- 200 degrees --, therefor.

In the Claims

In Column 12, Line 2, in Claim 1, after "450" insert -- degrees --.

In Column 12, Line 58, in Claim 16, after "450" insert -- degrees --.

In Column 13, Line 20, in Claim 20, after "450" insert -- degrees --.

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*